United States Patent [19]
Knights

[11] Patent Number: 5,752,857
[45] Date of Patent: May 19, 1998

[54] SMART CARD COMPUTER ADAPTOR

[75] Inventor: Anthony John Knights, Irvine, Calif.

[73] Assignee: ITT Corporation, New York, N.Y.

[21] Appl. No.: 653,579

[22] Filed: May 24, 1996

[51] Int. Cl.$^6$ ............................................ H01R 25/00
[52] U.S. Cl. ................ 439/638; 439/946; 439/945; 361/686; 235/380
[58] Field of Search .............................. 439/638, 639, 439/651, 946, 945, 75, 653, 502, 953, 352; 361/752, 684, 686, 737, 783, 728–730, 820; 235/380, 441, 492, 493

[56] References Cited

U.S. PATENT DOCUMENTS

| | | |
|---|---|---|
| 4,980,856 | 12/1990 | Ueno ........................... 439/945 |
| 5,036,429 | 7/1991 | Kaneda et al. ................ 361/392 |
| 5,136,467 | 8/1992 | Kaneda et al. ................ 361/392 |
| 5,155,663 | 10/1992 | Harase ......................... 439/651 |
| 5,184,282 | 2/1993 | Kaneda et al. ................ 361/395 |
| 5,296,692 | 3/1994 | Shino ........................... 361/752 |
| 5,330,360 | 7/1994 | Marsh et al. ................. 439/76 |
| 5,375,037 | 12/1994 | Le Roux ....................... 361/684 |
| 5,387,110 | 2/1995 | Kantner et al. ............... 439/59 |
| 5,391,083 | 2/1995 | Roebuck et al. .............. 439/76 |
| 5,391,094 | 2/1995 | Kakionki et al. ............. 439/638 |
| 5,411,402 | 5/1995 | Bethurum ..................... 439/77 |
| 5,457,601 | 10/1995 | Georgopulos et al. ......... 361/686 |
| 5,472,351 | 12/1995 | Greco et al. .................. 439/353 |
| 5,473,505 | 12/1995 | Kessoku et al. .............. 439/653 |
| 5,486,687 | 1/1996 | Le Roux ....................... 235/382 |
| 5,540,601 | 7/1996 | Botchek ....................... 439/502 |
| 5,563,400 | 10/1996 | Le Roux ....................... 439/75 |
| 5,625,534 | 4/1997 | Okaya et al. ................. 361/686 |
| 5,663,553 | 9/1997 | Aucsmith ..................... 235/492 |

FOREIGN PATENT DOCUMENTS 0 602 778 A2  6/1994  European Pat. Off. .

*Primary Examiner*—Neil Abrams
*Assistant Examiner*—Brian J. Biggi
*Attorney, Agent, or Firm*—Freilich Hornbaker Rosen

[57] ABSTRACT

Apparatus is described for coupling the contact pads (116, FIG. 4) of a smart card (30) to a computer device (10) that has a slot (12) for receiving an IC card, which provides a small but reliable card receiver to be stored outside the computer device. The apparatus includes an adaptor (80) with a front end forming a plug (84) that is mateable to the receptacle (82) at the rear of a standard IC card (14) of the type that has a rear I/O (input/output) connector. The adaptor has a card receiver (94) with a slot (100) that receives a smart card and has terminals (114) that engage contact pads of the smart card, with the terminals connected to contacts (92) of the adaptor plug. The card receiver is wider than the IC card for reliably receiving the card. The IC card can be stored in the IC card slot of the computer device, while only a relatively small adaptor is stored outside the IC card slot.

12 Claims, 4 Drawing Sheets

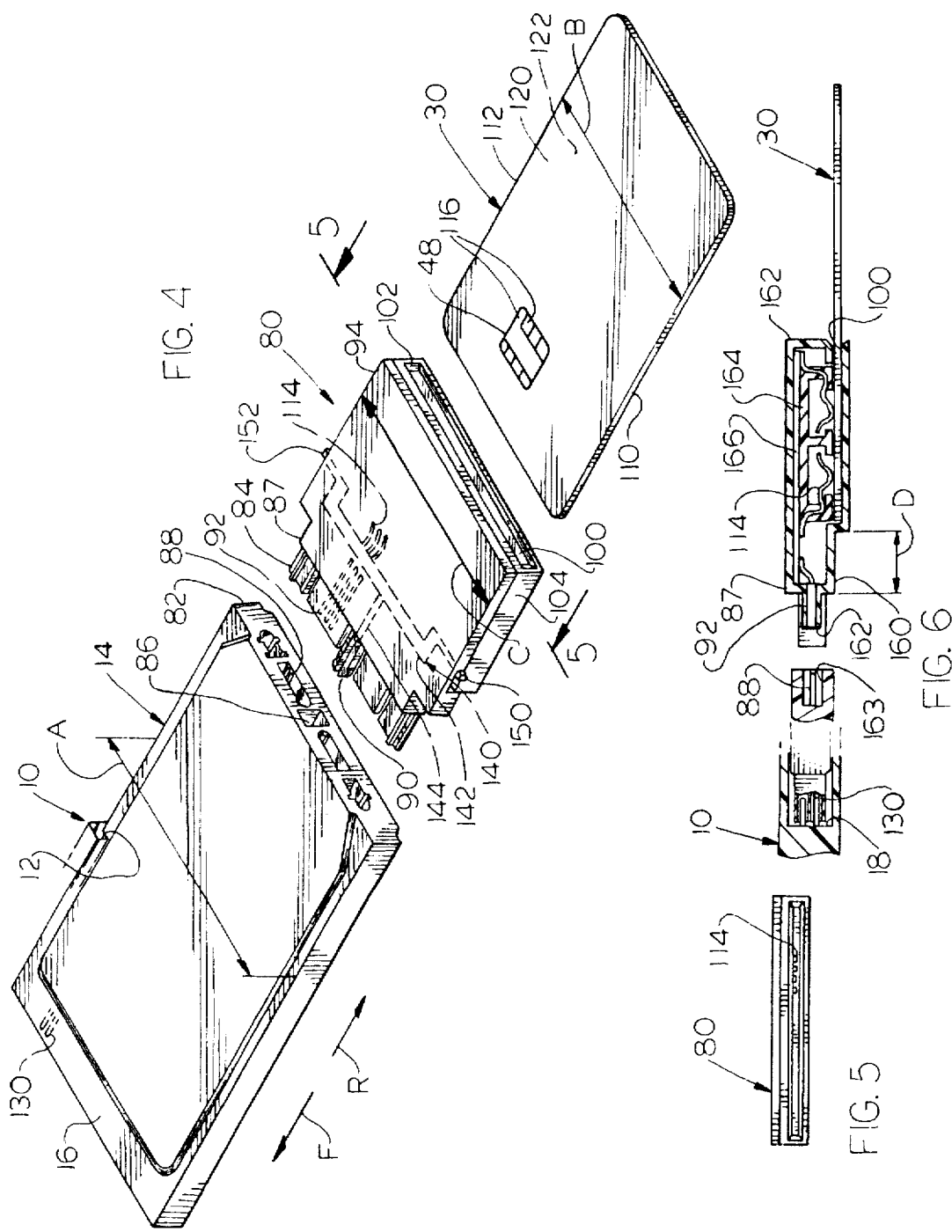

SMART CARD COMPUTER ADAPTOR

BACKGROUND OF THE INVENTION

Computer devices are commonly provided with IC card slots for receiving IC cards (often referred to as PC cards) constructed in accordance with PCMCIA (Personal Computer Memory Card International Association) standards. The thinnest standard IC card has a thickness of 3 mm. The most common type of standard IC card is the type II card which has a width of 54 mm (millimeters), a length of 85 mm, and a thickness across much of its width and length of 5 mm. Each card has a 68-position front connector with two rows of socket contacts that mate with pins at the host computer end of the IC card slot. Many IC cards are of the I/O (input/output) type with a rear connector having at least one row of pin contacts and with a hole for latching a mating connector thereto. One type of mating connector is attached to the front end of a cable, with the cable extending to equipment such as a local area network or modem.

Another type of standard card, constructed under ISO7816 standards is the large smart card, which is the size of a credit card with a thickness of about 0.82 mm. These cards are commonly solely of plastic except for circuitry molded therein, and except for a standard set of contact pads on one surface of the card. Such cards are gaining use in such applications as storing medical records or storing money value for purchases, in a card that can be conveniently carried in a wallet like a credit card. Standards for the large smart card prescribe a card having a width of 54 mm, which is the same as that for an IC card.

Although specialized electronic devices are available for directly writing/reading data into and out of smart cards, there is a need to perform these functions using common computer devices that have been adapted to receive IC cards. Since smart cards are thinner than IC cards and have contacts on a face instead of an end, a smart card cannot be directly read out or into an IC card slot.

One approach has been to construct an IC card of standard width, length, and thickness (5 mm) and with an IC card connector at its front end, but with a slot that can receive a large smart card, and with terminals for engaging the contact pads on the smart card. Unfortunately, when PCMCIA and ISO7816 standards were set, the width and length of the IC card was set to be equal to that of the large smart card. As a result, the slot in the special IC card that receives a smart card does not have side walls, since the side walls would increase the width of the IC card. Such special IC card results in a flimsy special IC card with poor guidance of the smart card.

Another approach has been to construct an extended IC card with its rearward extension being extra wide to form a wide slot entrance with short side walls for guiding a small portion of the card length. While this approach gives better, though not very good card guidance, it results in a special IC card that projects considerably rearward of the computer device slot that is intended to fully receive a standard length IC card. As a result, the extended IC card usually cannot be left in the computer device, since it projects out so a door cannot be closed, and so the projecting part of the IC card is vulnerable to damage.

It would be desirable if apparatus were available which enabled precise reception of a large smart card and its electrical coupling to a computer device with an IC card slot, which require only relatively low cost and compact special apparatus. Such apparatus would be especially desirable if it were available for Microsim cards as well as large smart cards.

SUMMARY OF THE INVENTION

In accordance with one embodiment of the present invention, apparatus is provided for transmitting data between a smart card of the type that has contact pads on a card face, and a computer device of the type that has a slot for an IC card (often called a PC card). The apparatus includes an adaptor which can be used with a standard IC card that has a rear connector. The adaptor has a front end forming an adaptor connector that is mateable to the IC card rear connector. The adaptor has a wide rear portion forming a slot for receiving and guiding a smart card. The adaptor also has terminals positioned to engage contact pads of the smart card, with the terminals connected to contacts of the adaptor connector. To transmit data between a smart card and a computer device, applicant inserts an IC card of standard shape and size into the card-receiving slot of a computer device. Applicant also mates the adaptor connector to the IC card rear connector, and inserts a smart card into the slot of the adaptor.

An adaptor which is especially useful for a computer device that has a keyboard and that has its IC card slot at the right side, has a smart card slot that opens 90° away from the direction in which the computer device IC card slot opens. This 90° angle facilitates insertion and removal of a smart card from the adaptor.

A special adaptor can be constructed to receive a Microsim card, which has a smaller width and length than a standard large smart card.

The novel features of the invention are set forth with particularity in the appended claims. The invention will be best understood from the following description when read in conjunction with the accompanying drawings.

BRIEF DESCRIPTION OF THE DRAWINGS

FIG. 4 is an exploded isometric view of an adaptor of the present invention, and of an IC card and a large smart card which can both be coupled to the adaptor.

FIG. 5 is a rear elevation view of the adaptor of FIG. 4, taken on line 5—5 thereof.

FIG. 6 is a sectional view of the adaptor of FIG. 4, with the smart card fully installed therein, and showing a portion of the IC card and of the computer device of FIG. 1.

DESCRIPTION OF THE PREFERRED EMBODIMENTS

Figure 1:
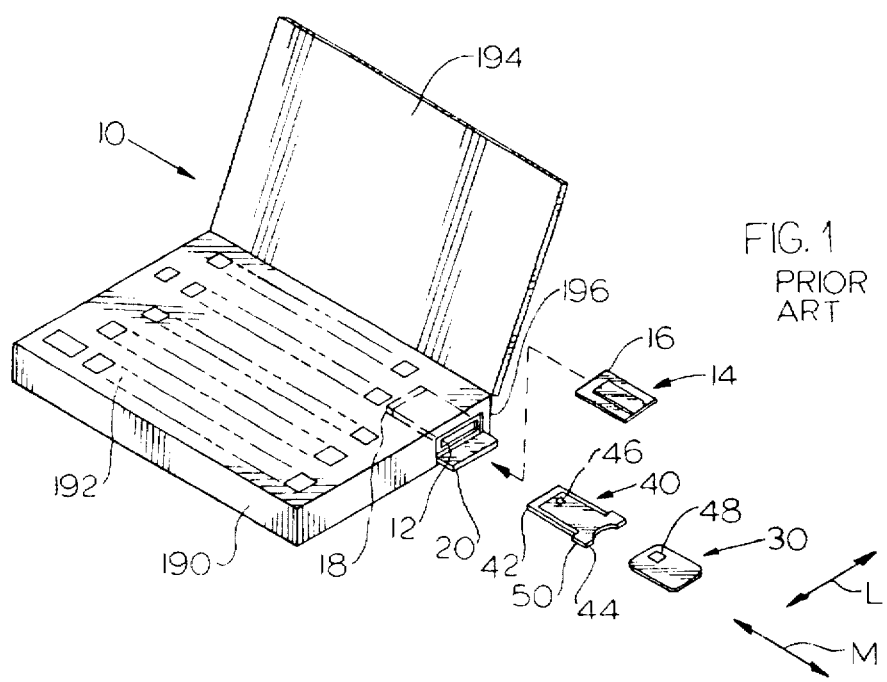
FIG. 1 is an exploded isometric view of a notebook computer device, of a standard IC card which can fit into a slot of the computer device, of an extended IC card, and of a large smart card which can project into the extended IC card, all in accordance with the prior art.

FIG. 1 illustrates a computer device 10 which is shown in the form of a notebook computer, which has an IC card slot 12 for receiving a standard IC card 14 (often referred to as a PC card). The slot 12 is deep enough that the card 14 can be fully inserted therein, until a front connector 16 of the card mates with a device connector 18 at the front end of the slot. A pivoting cover 20 then can be closed to cover the slot.

FIG. 1 also shows a large smart card 30 which is beginning to gain widespread use. Both the IC card 14 and the smart card 30 are formed according to PCMCIA standards, which specify a width of 54 mm and length of 85 mm for each. The popular type II IC card 14 has a thickness of 5 mm and has a construction which is usually too fragile to carry every day in an ordinary wallet. However, the large smart card 30 has a thickness of only about 0.82 mm and its circuitry is encased in solid molded plastic. As a result, the large smart card can be regularly carried in an ordinary wallet. The smart card 30 may carry medical records of a person, stored value for purchases, or other data. It is often desirable to transfer data (read and/or write it to the smart card) between a smart card 30 and a computer device 10 which is constructed only with an IC card slot for receiving a PCMCIA (type I, II or III) card 14.

Figure 2:
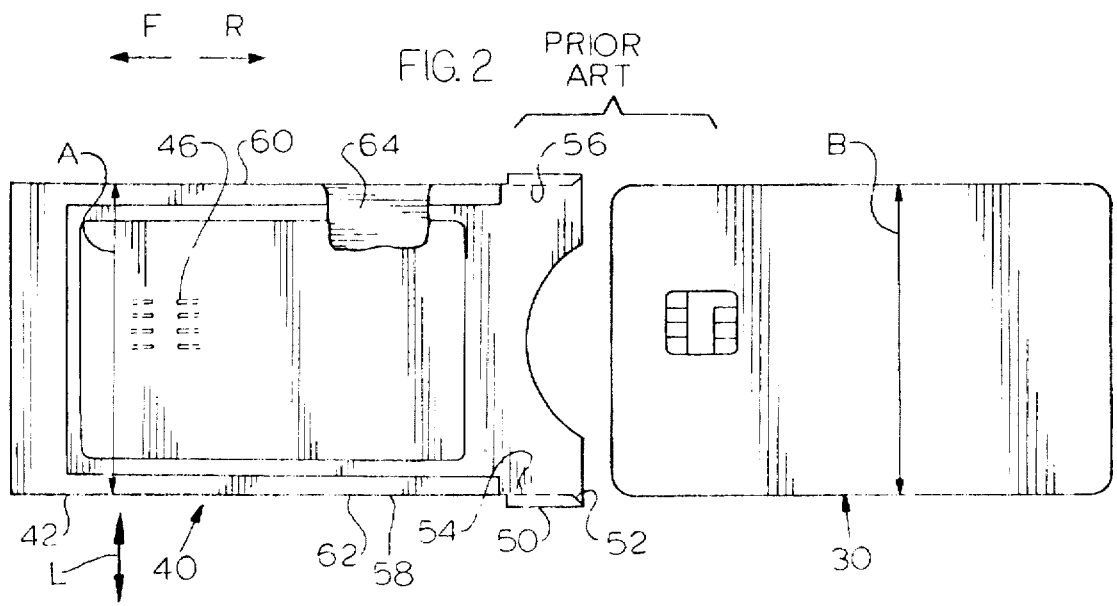
FIG. 2 is an exploded plan view of the prior art extended IC card and the large smart card of FIG. 1, with a section of the extended IC card top wall being cut away.

One approach for interfacing the smart card 30 with the computer device 10, is to provide an extra length or extended IC card 40. The extended IC card 40 can be inserted into a standard IC card slot 12 until its front connector 42 mates with the device connector 18. The extended IC card 40 has a smart card-receiving slot 44 into which the smart card 30 can be inserted, and has terminals 46 for engaging contact pads at a multi-contact surface region 48 of the smart card. However, there are two major disadvantages of the extended IC card 40. One disadvantage is that it has an extension portion 50 which will project from the computer device 10, and prevent the cover 20 from pivoting closed. As shown in FIG. 2, the extension 50 is provided so there is a window with tapered entrance at 52 to guide the smart card 30 into position, and to provide card edge guides 54, 56 to locate the card in a lateral direction L. Such card edge guides are desirable because the portion 58 of the extended IC card lying forward (in direction F) of the extension 50 has the same width A as the width B of the smart card. Using the same width results in the extended IC card 40 having no card edge guides at its opposite side 60, 62. FIG. 2 shows a region of the bottom wall 64 of the extended IC card, which has no upstanding side wall to guide a smart card. Although the guidance provided by the extension 50 is helpful, the smart card 30 is still not well guided into position.

Figure 3:
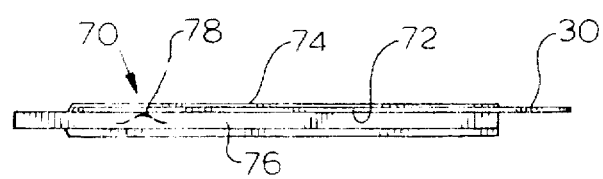
FIG. 3 is a side elevation view of another prior art IC card constructed to receive a smart card, and of a smart card fully installed therein.

FIG. 3 is a side view of another prior art apparatus 70 for enabling coupling of a smart card 30 to a computer device that has an IC card slot. The apparatus for coupling is of the same size as a standard type II IC card, in width, length, and thickness. It has a slot 72 formed by a flap 74 lying over a body 76. The smart card 30 is inserted into the slot until it engages terminals 78. Although the apparatus 70 can remain in the IC card of the computer device with the door closed, it has disadvantages. One disadvantage is that it may be required to remove the coupling device 70 before the smart card 30 can be inserted therein, since the cantilevered flap 74 may move down and close the rear end of the slot. Also, the slot does not have any opposite edge guides, so care must be taken to keep the smart card 30 aligned with the apparatus 70 as it is inserted into the IC card. All of this makes the coupling means 70 awkward to use.

In accordance with the present invention, applicant provides an adaptor 80 shown in FIG. 4, for transferring data between a smart card 30 and a computer device 10. The adaptor is used in conjunction with an IC card 14 of the type that has an I/O (input output) receptacle connector or receptacle 82 at its rear end. While some IC cards have a connector 16 only at their front ends, a large number of IC cards have rear connectors or rear receptacles 82 at their rear ends. Examples of such rear connectors are shown in U.S. Pat. Nos. 5,411,402 and 5,387,110, although other constructions of IC card rear connectors have been proposed. The adaptor has an I/O plug, which can be referred to as an adaptor connector or header 84 at its front end 87, which is designed to mate with a certain kind of I/O receptacle 82.

The particular receptacle 82, which forms the IC card rear connector, has a central latch hole 86 and an interrupted row of pin contacts 88. The plug 84 has a latch 90 that can enter the latch hole 86 and latch thereat, and has an interrupted row of adaptor socket contacts 92 which can mate with the pin contacts 88. The receptacle also has a rear smart card-connecting portion, or card receiver 94, which is constructed to receive the large smart card 30. While the IC card 14 has a maximum width A equal to that B of the smart card, the receiver has a greater width C. As a result, the receiver 94 is readily constructed with a smart card slot 100 of slightly greater width than that of the smart card for receiving it. The smart card slot 100 has a lead in 102 to guide the card into position, and has side edge walls 104 that guide the opposite edges 110, 112 of the smart card. The adaptor has a group of terminals 114 for engaging surface contact pads 116 on the smart card, either directly or via a circuit board. The pads lie in the multi-contact surface region 48 on a first or pad face 120 of the card, which lies opposite a second face 122 that does not have such contact pads. Each of the terminals 114 is connected to a corresponding one of the socket contacts 92. Thus, the smart card 30 can be connected to the computer device 10 to transmit data between them, by inserting the smart card 30 into the adaptor 80 so the smart card contact pads 116 are engaged by the terminals 114 that are connected to the sockets 92.

The adaptor is mated to the IC card by mating the adaptor plug 84 with the IC card receptacle 82, so the socket contacts 92 engage the pin contacts 88. The pin contacts 88 are coupled (directly or through signal processing circuitry) to corresponding card socket contacts 130 at the front end of the IC card. The socket contacts 130 engage pin contacts of the computer device connector. In many cases, the adaptor 80 will be used to transmit data between the computer device 10 and a few or many, successive different smart cards 30. In that case, the adaptor 80 can be mated to the smart card through the plug and receptacle connectors 84, 82, and each smart card at a time can be inserted into the adaptor slot 100 and withdrawn. If it is desired to secure the electronic device for transport, such as to enable it to be moved to a new location, the adaptor 80 can be unmated from the IC card, although the IC card can be left in the electronic device, if desired. Where the IC card slot in the computer device can fully receive the IC card, the IC card will not project from the slot, and will not be damaged by hitting an object, especially where a door is provided that can be pivotally closed over the slot to avoid the entrance of dirt.

The particular adaptor 80 shown in FIG. 4, has a latching mechanism 140 that includes a bar 142 that extends between opposite sides of the adaptor, and that is connected to a rod 144. When handles 150, 152 at opposite sides of the adaptor are moved forward, they move the rod 144 forward, to prevent a pair of arms of the latch 90 from deflecting together. Thus, the plug 84 can be mated to the receptacle 82, with the latch 90 entering the latch hole 86 of the receptacle and the sockets and pins mating. Then, the handles 150, 152 can be moved forward, in the direction F, so the rod 144 prevents the latch arms from separating, to thereby lock the adaptor to the IC card. The latch is not always necessary, in as much as the resistance to rearward pullout of the smart card 30 is usually less than resistance to pullout of the unlatched IC card 14 from the computer device.

Figure 6A:
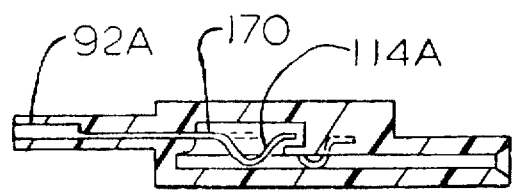
FIG. 6A is a sectional view of an adaptor construction modified from that of FIG. 6.

As shown in FIG. 6, the adaptor front 87 has a coupling portion 160 extending rearward of the socket-holding portions 162 that enter holes 163 in the card receptacle. The coupling portion 160 at the front of the adaptor, extends by a distance D of at least ten millimeters in accordance with PCMCIA standards. This is to assure that if the IC card slot in the computer device is several millimeters deeper than required for the rear of the IC card to be flush with the outside of the computer device, that the adaptor can still fully mate with a fully installed IC card. FIG. 6 shows one possible construction of the adaptor, wherein it includes a housing 162 forming the slot 100 and opposite side edge guides at the slot. A separate terminal device 164 is installed in the housing, and includes the card-engaging terminals 114. The socket contacts 92 are molded in place, and have tails soldered to traces on a circuit board 166, with the terminals 114 also having tails soldered to the circuit board traces, to thereby connect the terminals to the socket contacts. FIG. 6A illustrates another construction, wherein socket contacts 92A include tails 170 formed as card-engaging terminal 114A. Of course, tails of the socket contacts and of the terminals can be directly connected together instead of being integral.

Figure 7:
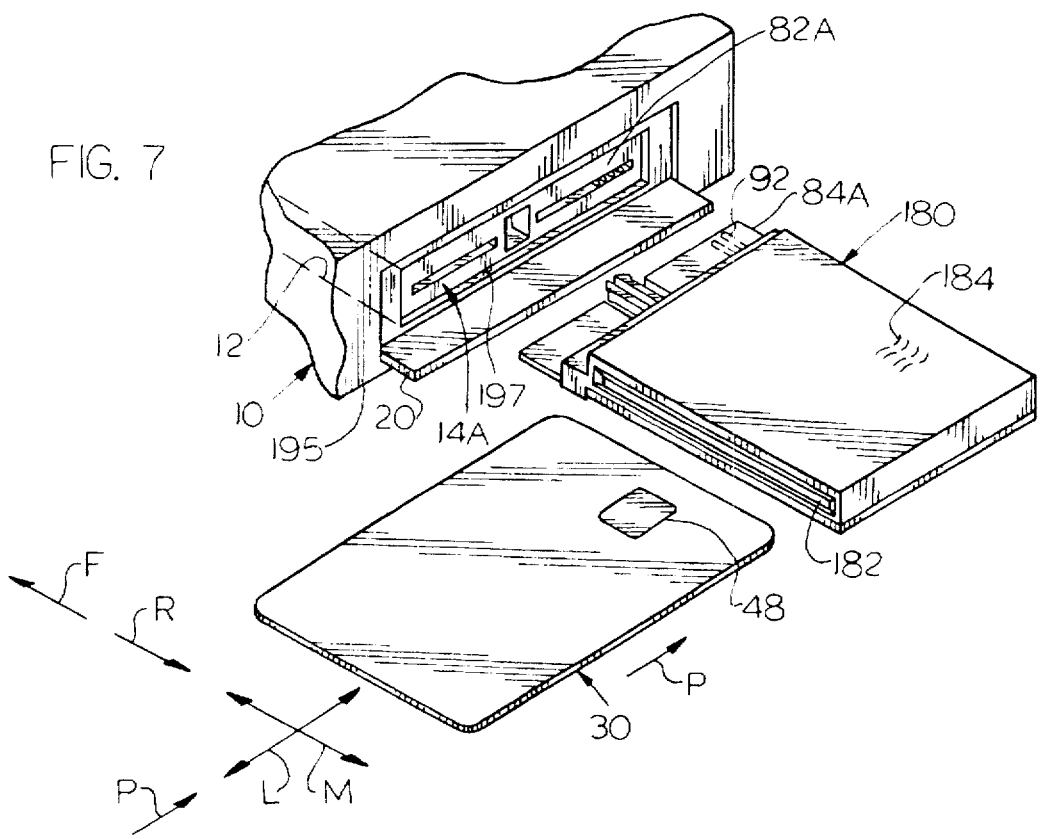
FIG. 7 is an exploded isometric view of an adaptor of another embodiment of the invention, and also showing a large smart card which can be installed therein, a computer device, and the IC card of FIG. 4 in a fully installed position in the IC card slot of the computer device.

FIG. 7 illustrates another adaptor 180 which is similar to the adaptor 80 of FIG. 4, except that the adaptor 180 of FIG. 7 has a card-receiving slot 182 which extends in lateral directions L which are 90° to the forward and rearward (F, R) longitudinal directions M along which the IC card slot 12 in the computer device 10 extends. Both of the directions L, M are usually horizontal. When the IC card 30 is projected in the posterior direction P into the slot 182, terminals 184 of the adaptor engage contact pads in the multicontact surface region 48 of the card. The terminals 184 are connected to socket contacts 92. It may be noted that the I/O plug 84A of the adaptor 180, is shown as being of a different version than that of FIG. 4, and that the adaptor 180 of FIG. 7 is designed to mate with the modified I/O receptacle 82A of the IC card 14A.

An important advantage of the right angle adaptor 180 is that it can facilitate insertion and removal of the smart card 30. As shown in FIG. 1, laptop computers and other computer devices 10 are often constructed with anterior or forward ends 190 that face the operator, who may be facing a keyboard 192 and a screen 194. The posterior or rearward end 196 is furthest from the operator. The IC card slot 12 is commonly placed at the right side of the computer, near its posterior end 196. If the smart card 30 must be inserted and retracted in the longitudinal directions M, then this requires considerable space beyond the right side of the computer device. Also, it is somewhat inconvenient for an operator to reach to the rearward end of the computer device and move the cards in the longitudinal directions M. By using the adaptor 180 of FIG. 7, applicant avoids the need for a large area beyond the right side of the computer device, that is, beyond the rear walls 195 of the computer device that surround the IC card slot rear end 197. Instead, the operator moves the smart card in the lateral directions L. In one example, the adaptor 180 projects 70 mm in the longitudinal direction M beyond the IC card receptacle 82A. However, if the adaptor 80 of FIG. 4 is used, which extends about 50 mm to the right of the card receptacle 82, then an additional area having a length of about 150 mm is required for an operator to easily insert and pullout the memory cards. As a result, the right angle adaptor 180 of FIG. 7 saves about 130 mm of space to the right of the computer device.

Figure 7A:
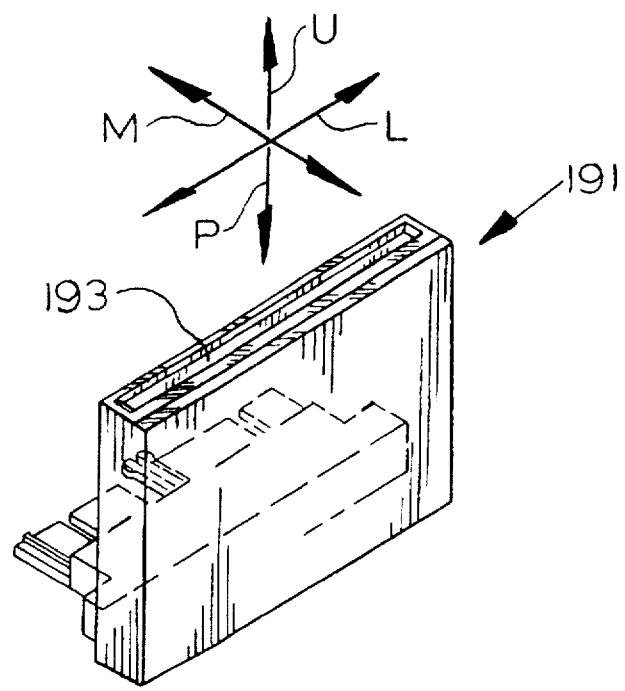
FIG. 7A is an exploded isometric view of an adaptor of another embodiment of the invention wherein the card-receiving slot extends in the vertical direction.

FIG. 7A illustrates another right angle adaptor 191 that is similar to those of FIGS. 4 and 7, except that the adaptor 191 has a card-receiving slot 193 which extends in vertical directions U, P which are 90° to the horizontal directions L, M. The vertical adaptor 191 can be used where there is a space of only about 30 mm to the right of the computer device. Also, it is often easier to vertically insert and remove a smart card than to do so horizontally. The adaptor can be provided with braces to brace the adaptor on the computer device, to avoid excessive bending when a smart card is inserted or withdrawn.

Figure 8:
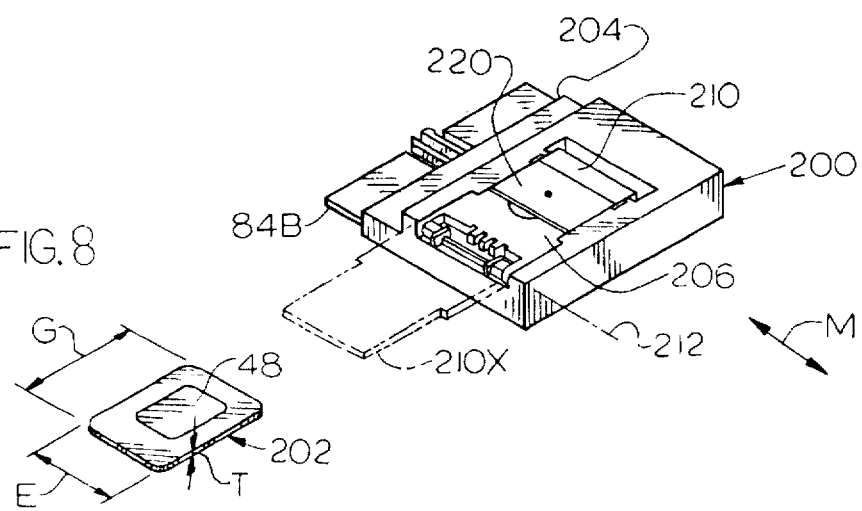
FIG. 8 is an exploded isometric view of an adaptor constructed in accordance with another embodiment of the invention, and of a Microsim card which can be received in the adaptor, with the adaptor door shown closed, and, in phantom lines, shown open.
Figure 9:
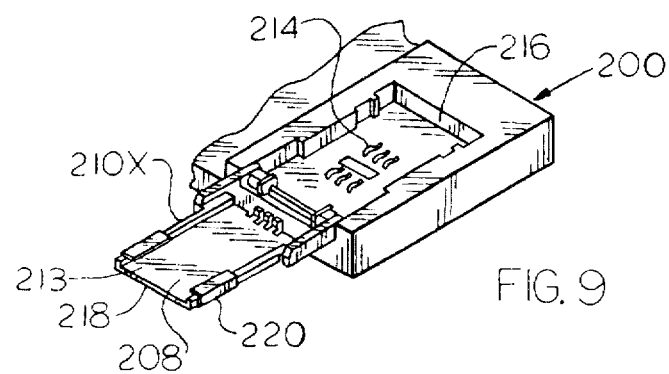
FIG. 9 is a partial view of the adaptor of FIG. 8, with the door in the open position.

FIGS. 8 and 9 illustrate another adaptor 200, which is designed to transfer data between a small smart card or Microsim card 202 and a computer device. Microsim cards 202 have a width E and length G that are each about one-third that of the large smart card, but with the same thickness T of about 0.82 mm. The small smart cards have been installed semipermanently in mobile telephone and other dedicated devices. Because of their small size, they are convenient to install in small hand-held devices. The adaptor 200 includes an adaptor front end 204 with a plug 84B which can be identical to the plug 84 of FIG. 4 or the plug 84A of FIG. 7. The adaptor has a door 210 with a largely closed outer face 206 and an inner open face 208. The door pivots about a door axis 212 between the closed position shown in solid lines in FIG. 8, and the opened position shown at 210X in FIG. 8 and in FIG. 9. Such pivoting door is well known for use with small smart cards.

The door axis 212 preferably extends in the longitudinal direction M, so the open door does not interfere with the computer device, in an adaptor of a small size. The smart card is inserted into a smart card slot 213 of the opened door. The door is then pivoted closed so the multi-contact surface region 48 of the card is engaged by terminals 214 that pass through the door inner face 213. A closure wall 216 closes the outer end 218 of the slot, to prevent removal of the card until the door is pivoted open. A member 220 which forms part of the slot 212, can be slid to lock the cover in its closed position as shown in FIG. 8. By using an adaptor 200 with an adaptor connector 84B in the form of a plug that can mate with a receptacle connector at the rear of a common IC card, applicant is able to transfer data between the small smart card 202 and an electronic device.

Figure 10:
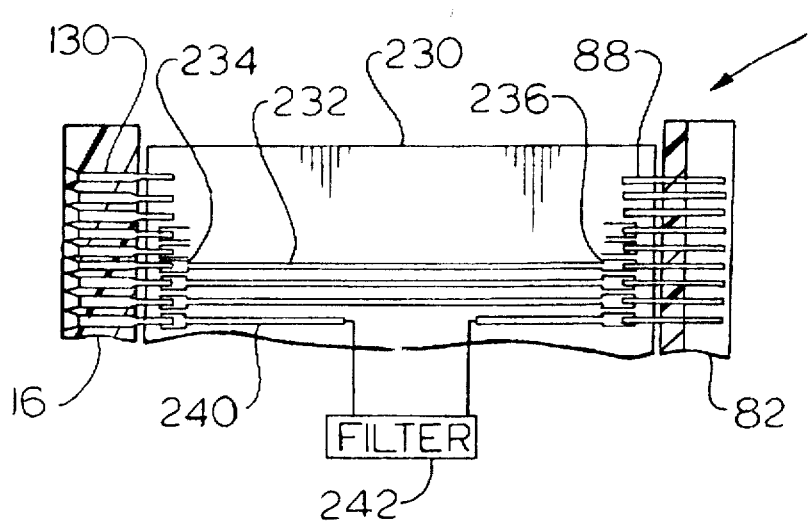
FIG. 10 is a partial plan and schematic view of an example of the IC card of FIG. 4.

FIG. 10 provides an example of the connections that can be provided in the IC card 14. The IC card includes a circuit board 230 with traces such as 232 having forward and rearward ends. Tails of the socket contacts 130 at the front of the card are connected to the circuit board trace 232 at 234, while pins 88 at the rear connector 82 of the card are connected to the trace 232 at its rear end 236. In this example, the trace 232 forms a simple conductor that merely carries electrical signals from the adaptor to the computer device without signal processing and therefore without substantial signal modification. Another signal path at 240 includes a filter 242 in series with the trace. In one example, the filter 242 can be connected to a ground conductor on the circuit board to short to ground any high voltage singals, and can include a filter that prevents the passage of frequencies outside a certain range so as to minimize the transfer of noise signals.

A variety of signal processing circuitry can be used along the signal paths such as 240, including a serial to parallel converter, etc. It is even possible to provide signal processing in the adaptor. The IC card 14 can be a card intended for the transfer of data between outside sources and a computer device, to transfer signals not only to and from smart cards, but also useful for other accessories such as modems, local area networks, and other external devices. For most of such other accessories, a plug is used which connects through a long cable to the accessory. In the present situation, an adaptor is provided which has a plug and a card receiving contact, with card-engaging terminals connected to socket contacts of the plug, all in a single rigid frame or housing wherein all parts are fixed in position except for the deflectable parts of the terminals.

Thus, the invention provides apparatus for transferring data between smart cards, which are thin and have contact pads on their faces, to a computer device that has an IC slot for receiving standard IC cards. The apparatus includes an adaptor having a front end forming an adaptor connector or I/O plug, that can be mated to a rear card connector or I/O receptacle of an IC card that has such rear connector. The adaptor includes walls forming a smart card slot or card receiver for receiving the smart card and has terminals for engaging the smart card contact pads. The terminals are connected to socket contacts of the adaptor plug connector. As a result, when the IC card with a rear connector thereon is fully inserted into the IC card slot of the computer device, the adaptor can be mated to the rear connector of the card, so smart cards can be inserted into and removed from the adaptor, to enable the transfer of data between the smart cards and the computer device. The adaptor can have a slot opening in a lateral direction or in a vertical direction (when the slot extends horizontally), which are largely perpendicular to the direction of mating of the adaptor to the IC card connector, to facilitate handling of smart cards in some computer devices. The adaptor can be formed to receive and engage small smart cards, or Microsim cards. The IC card that connects the adaptor to the computer device, can be constructed with special conductors for connecting contacts of its front and rear connectors, with or without signal processing and usually with substantially no signal processing, to transfer signals between the adaptor and the computer device.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. Apparatus for use with an IC card that is insertable into an IC card slot of a computer device, where the IC card has a rear with a rear card connector having a group of card rear contacts, which enables the transfer of information between a smart card and the computer device, comprising:

an adaptor which has a front end forming an adaptor connector that has a group of adaptor contacts, with said adaptor connector being mateable to said rear card connector so said group of adaptor contacts engage said group of card rear contacts;

said adaptor including walls forming a smart card slot constructed to receive said smart card, and said adaptor having a plurality of terminals each positioned to engage one of said surface pads of a smart card in said smart card slot, with each of said plurality of terminals connected to one of said adaptor contacts;

of said group of IC card rear contacts and said group of adaptor contacts, one group comprises pin contacts and the other group comprises socket contacts, while said terminals of said adaptor are constructed to engage surface pads.

2. The apparatus described in claim 1 wherein:

said adaptor has a rear portion that is spaced rearwardly along a longitudinal direction, from said adaptor front end;

said adaptor rear portion is constructed to receive a microsim card which has a width less than the width of said IC card, said adaptor rear portion having a base and a door that includes said walls forming a smart card slot, said door being pivotable about a door axis between open and closed portions with said slot having an outer end that is open in said door open position and closed in said door closed position, with said door having an inner face, and with said card-engaging terminals positioned to project through said door inner face and engage said card when said door is in said closed position;

said door axis extending substantially parallel to said longitudinal direction, whereby to avoid interference by the computer device in operating said door.

3. Apparatus for use with an IC card constructed in accordance with PCMCIA standards for insertion into an IC card slot of a computer device, where the IC card has a rear forming an I/O receptacle that includes a central latch hole and a laterally extending row of pin contacts, where the apparatus enables the transfer of information between a smart card and the computer device where the smart card has a multi-contact surface region with conductive surface pads arranged in accordance with ISO standards, comprising:

an adaptor which has a front end forming an IC card I/O plug that is mateable to said I/O receptacle, with said I/O plug including a latch that is insertable into said latch hole to latch thereto and also including a laterally-extending row of socket contacts that are mateable to said pin contacts, said adaptor having a dielectric housing front portion that surrounds said socket contact so said socket contacts open only in a forward direction to receive only pin contacts;

said adaptor has a rear portion that includes walls forming a smart card slot constructed to receive said smart card, and a plurality of card-engaging terminals each positioned to engage one of said surface pads of a smart card lying in said slot, with each of said plurality of terminals connected to one of said socket contacts.

4. The apparatus described in claim 3 including said computer device with said IC card slot thereof and including said IC card with said I/O receptacle thereof, and wherein:

said slot in said computer device has a slot rear end, and said computer device has a housing with a rear housing surface surrounding said IC card slot rear end;

said IC card lies in a fully inserted position in said IC card slot, with said I/O receptacle lying about even with said rear housing surface but free of projection therefrom;

said adaptor front end includes a coupling portion extending a plurality of millimeters rearward of said I/O connector and having a width and height no greater than the width and height, respectively of said IC card, and said adaptor has a rear portion that forms said smart card slot, said smart card has the same width as said IC card, and said adaptor rear portion has a width that is greater than the width of said IC card.

5. The apparatus described in claim 3 wherein:

said adaptor rear portion is spaced rearwardly along a longitudinal direction, from said adaptor front end;

said smart card slot is open in a direction which is angled about 90° from said longitudinal direction, whereby to ease smart card insertion and withdrawal.

6. The apparatus described in claim 3 wherein:

said adaptor rear portion is spaced rearwardly along a longitudinal direction, from said adaptor front end;

said adaptor rear portion is constructed to receive a microsim card which has a width less than the width of said IC card, said adaptor rear portion having a base and a door that includes said walls forming a smart card slot, said door being pivotable about a door axis between open and closed positions with said slot having an outer end that opens in said door open position and having a slot inner end adaptor rear portion having a closure wall positioned to block said outer end in said closed position of said door, with said door having an open face and with said card-engaging terminals positioned to project through said door open face and engage said card when said door is in said closed position;

said door axis extending substantially parallel to said longitudinal direction, to avoid interference by the computer device in pivoting of said door for a small adaptor.

7. Apparatus for transmitting data between a computer device with an IC card slot and a smart card having contact pads, comprising:

an IC card that can be received in the IC card slot, said IC card having front and rear connectors that each have contacts, and said card having a circuit board with means for coupling a plurality of contacts of said front and rear card connectors for transmitting data between them, with said IC card rear connector having walls surrounding the contacts of said rear connector so said contacts open only in a rearward direction;

an adaptor that includes an adaptor front portion forming adaptor connector means for coupling mechanically and electrically to said IC card rear connector, an adaptor rear portion forming means for receiving a smart card, and contact-terminal means for carrying data signals between the smart card contact pads and said adaptor connector means, said adaptor contact means include adaptor contacts that mate in a forward direction to mate with said contacts of said IC card rear connector;

of said contacts of said IC card rear connector and said adaptor contacts, one of said contacts are pin contacts and the other are socket contacts.

8. A method for transferring data between a smart card which has a thickness of no more than two millimeter and that has opposite faces with a first of said faces having a plurality of contact pads, and a computer device that has walls forming an IC card-receiving slot of a thickness of at least three millimeters and a lateral width for closely receiving an IC card of a predetermined lateral IC card width where said IC card-receiving slot has an accessible rear slot end and also has a front slot end, and where said computer device has an IC card-mating device connector having contacts at the front of the IC card-receiving slot, and where the smart card and the IC-card-receiving slot have substantially the same lateral width, comprising:

installing an IC card with front and rear card connectors that each have card contacts, in said IC card-receiving slot, with said front card connector mated to said device connector;

installing an adaptor having front and rear end portions, with said front end portion having an adaptor front connector with adaptor front contacts and said rear end portion having a smart card slot and terminals lying partially therein and electrically connected to said adaptor contacts, so said adaptor front connector mates with said IC card rear card connector, wherein of said rear card contacts and said adaptor front contacts one is a pin and the other is a socket;

inserting said smart card into said smart card slot and allowing said adaptor contacts to engage said contact pads of said smart card by pressing in a direction perpendicular to front and rear directions against said contact pads;

passing currents from said smart card contact pads, through said terminals to said adaptor contacts, while said smart card lies completely outside said IC card slot, and passing said currents from said adaptor contacts to said card contacts of said rear card connector and to said contacts of said front card connector and to said device connector contacts.

9. The method described in claim 8 wherein:

said step of installing an adaptor includes moving the adaptor front connector in a predetermined longitudinal direction to mate to said IC card rear card connector, and installing an adaptor with its smart card slot extending perpendicular to said longitudinal direction.

10. Apparatus for use with an IC card that is insertable into an IC card slot of a computer device, where the IC card has a rear with a rear card connector having a plurality of card contacts, which enables the transfer of information between a smart card and the computer device, comprising:

an adaptor which has a front end forming an adaptor connector that has a plurality of adaptor contacts, with said adaptor connector being mateable to said rear card connector so said plurality of adaptor connector contacts engage said plurality of card contacts;

said adaptor including walls forming a smart card slot constructed to receive said smart card, and said adaptor having a plurality of terminals each positioned to engage one of said surface pads of a smart card in said slot, with each of said plurality of terminals connected to one of said adaptor contacts;

said adaptor connector is constructed to mate with said rear connector by movement of said adaptor connector in a forward longitudinal direction;

said smart card slot is open in a direction which is angled about 90° from said longitudinal direction, whereby to ease smart card insertion and withdrawal.

11. The apparatus described in claim 10 wherein:

said adaptor contacts extend in a row along a predetermined lateral direction (L);

said direction which is angled about 90° from said longitudinal direction, is also angled about 90° from said lateral direction, whereby the smart card can be moved largely vertically into and out of said smart card slot when the IC card slot extends horizontally.

12. The apparatus described in claim 10 wherein:

said adaptor contacts extend in a row along a predetermined lateral direction (L), and said smart card slot is angled to receive smart cards moving substantially parallel to said lateral direction.

* * * * *